United States Patent
Bramanti et al.

(10) Patent No.: US 11,069,798 B2
(45) Date of Patent: Jul. 20, 2021

(54) BALLISTIC TRANSPORT DEVICE AND CORRESPONDING COMPONENT

(71) Applicant: STMICROELECTRONICS S.R.L., Agrate Brianza (IT)

(72) Inventors: Alessandro Paolo Bramanti, Maglie (IT); Alberto Pagani, Nova Milanese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 62 days.

(21) Appl. No.: 16/377,080

(22) Filed: Apr. 5, 2019

(65) Prior Publication Data

US 2019/0312136 A1 Oct. 10, 2019

(30) Foreign Application Priority Data

Apr. 9, 2018 (IT) .................. 102018000004306

(51) Int. Cl.
| | |
|---|---|
| *H01L 29/76* | (2006.01) |
| *H01L 29/778* | (2006.01) |
| *H01L 29/423* | (2006.01) |
| *H01L 29/10* | (2006.01) |
| *H01L 29/06* | (2006.01) |

(Continued)

(52) U.S. Cl.
CPC ...... *H01L 29/7606* (2013.01); *H01L 29/0657* (2013.01); *H01L 29/0665* (2013.01); *H01L 29/1029* (2013.01); *H01L 29/1066* (2013.01); *H01L 29/42316* (2013.01); *H01L 29/66462* (2013.01); *H01L 29/7787* (2013.01); *H01L 29/2003* (2013.01)

(58) Field of Classification Search
CPC . H01L 29/775; H01L 29/778; H01L 29/7787; H01L 29/1029; H01L 29/42316; H01L 29/66439; H01L 29/66462
USPC ........................................................ 257/29
See application file for complete search history.

(56) References Cited

U.S. PATENT DOCUMENTS

| | | | |
|---|---|---|---|
| 5,362,972 A | 11/1994 | Yazawa et al. | |
| 5,640,022 A * | 6/1997 | Inai ..................... | B82Y 10/00 257/14 |

(Continued)

FOREIGN PATENT DOCUMENTS

GB 2304992 A 3/1997

OTHER PUBLICATIONS

"Two-dimensional electron gas," Wikipedia, https://en.wikipedia.org/wiki/Two-dimensional_electron_gas, retrieved May 4, 2018.

(Continued)

*Primary Examiner* — Matthew E Warren
(74) *Attorney, Agent, or Firm* — Seed Intellectual Property Law Group LLP (57) ABSTRACT

A device includes a particle propagation channel, a particle deflector, a particle source, and a particle sink. The particle deflector facilitates ballistic transport of particles from a particle inflow portion through a particle flow deflection portion to a particle outflow portion. The particle deflector is arranged at the particle flow deflection portion and is activatable to deflect particles in the flow deflection portion and is configured to selectively prevent the particles from reaching the particle outflow portion. The particle source and particle sink are configured to cause a current path of the particles through the device.

20 Claims, 6 Drawing Sheets

(51) Int. Cl.
  *H01L 29/66* (2006.01)
  *H01L 29/20* (2006.01)

(56) References Cited

U.S. PATENT DOCUMENTS

| | | | | |
|---|---|---|---|---|
| 5,701,017 A | * | 12/1997 | Patel | B82Y 10/00 |
| | | | | 257/194 |
| 8,803,340 B2 | | 8/2014 | Moddel | |
| 2007/0008778 A1 | * | 1/2007 | Wang | G11C 16/3427 |
| | | | | 365/185.18 |
| 2008/0136454 A1 | * | 6/2008 | Diduck | H03K 19/08 |
| | | | | 326/102 |
| 2016/0155839 A1 | * | 6/2016 | Strachan | H01L 29/7881 |
| | | | | 257/29 |
| 2016/0190257 A1 | * | 6/2016 | Tzeng | H01L 29/1606 |
| | | | | 250/208.2 |

OTHER PUBLICATIONS

Reitzenstein, S. et al., "Logic AND/NAND gates based on three-terminal ballistic junctions," Electronic Letters, 38(17), Aug. 15, 2002, 2 pages.
Wolpert, David et al., "NAND Gate Design for Ballistic Deflection Transistors," IEEE Transactions on Nanotechnology, 10(1), Jan. 2011, 5 pages.
Zhu, Zixu et al., "Graphene geometric diodes for terahertz rectennas," Journal of Physics D: Applied Physics., 46:185101, 2013, 6 pages.

* cited by examiner

BALLISTIC TRANSPORT DEVICE AND CORRESPONDING COMPONENT

BACKGROUND

Technical Field

The description relates to electronic ballistic (or quasi-ballistic) devices.

Electronic ballistic devices, such as, e.g., ballistic transistor-like devices, may be applied to:

low-power circuits, featuring low thresholds, power circuits and power management (ballistic devices may be able to carry relatively high currents at low voltages), or high-frequency circuits featuring frequencies potentially up to (e.g., tens of) THz, that can be coupled to photonic circuits and/or systems.

Description of the Related Art

In a solid medium, e.g., a crystal, electrons may undergo a number of scattering events, that is collisions with impurities, defects and/or atoms which may be comprised within the medium. Such type of electron transport may be described in the Drude model of electrical conduction. The following may be noted regarding electron transport and scattering events:

the electron trajectories appear random, due to scattering events, rethermalization occurs, the electrons may have a non-zero net movement when an electric field is present, in a direction that may be aligned with a direction of the electric field, numerous scattering events exist even in good conductors, due to scattering events, little momentum may be gained, and due to scattering events, short mean free paths may exist (e.g., 30-60 nm in gold), wherein the mean free path for an electron is an average length that the electron can cover between two subsequent scattering events.

Reducing the number of scattering events may therefore be desired, for example by reducing the number of impurities in a crystal and/or by lowering a working temperature of the crystal.

Ballistic conduction (ballistic transport) may be regarded as transport of electrons (or holes or phonons) in a medium with negligible electrical resistivity due to scattering events, for example ballistic transport may be observed when the mean free path (mfp) of the electrons in a medium is longer than a size of the medium traveled by the electron. In ballistic transport, the electrons within the medium may follow, on average, Newton's second law of motion at non-relativistic velocities.

For example, in ballistic conduction, due to the (almost) absence of scattering events:

few or no scattering events may occur with the lattice: the electrons may vary trajectory (only) in the event of collision with sides of the medium (experimental results show symmetric bouncing of the electrons off the walls, similar with respect to a ray bouncing off a reflecting surface in optical geometry), long mean free paths may be achieved (e.g., hundreds of nanometers at ambient temperature), the electrons may be highly accelerated, the electrons may behave substantially as a classical, Newtonian particle, i.e., a projectile-like type of motion may be achieved.

BRIEF SUMMARY

According to one or more embodiments, a device includes:

a particle propagation channel including a particle inflow portion, a particle outflow portion, and a particle flow deflection (either attractive or repulsive) portion between the particle inflow portion and the particle outflow portion, the particle propagation channel being configured to facilitate ballistic transport of particles from the particle inflow portion to the particle outflow portion, a first particle deflector arranged at the particle flow deflection portion, the first particle deflector being activatable to deflect (attract and/or repulse) particles propagating in the particle flow deflection portion and prevent the particles from reaching the particle outflow portion, and a particle source at the particle inflow portion of the particle propagation channel, and a particle sink at the particle outflow portion of the particle propagation channel, wherein the particle source and the particle sink being configured to cause a current path of the particles through the device.

One or more embodiments may include a corresponding (e.g., solid-state) component.

The claims are an integral portion of the disclosure of the invention as provided herein.

One or more embodiments may relate to a three-terminal, transistor-like ballistic devices, wherein control of the ballistic current flow between two terminals can be implemented by means of a third control terminal, this is in contrast with conventional two-terminal devices.

One or more embodiments may include an electronic ballistic transport device, e.g., a transistor working at high frequencies, for example in a range of (tens of) THz.

One or more embodiments may exhibits high mobility of electrons and long mean free paths: the possibility exists to exploit a boundary geometry of the devices.

One or more embodiments may exhibit one or more advantages, such as:

2D ballistic devices may be provided, flexibility, the electronic ballistic devices may be applied to power, low-power and high-frequency applications, and/or easiness of fabrication.

One or more embodiments may achieve the previous results with a simple fabrication method, e.g., no bodies may be comprised in the middle of an electron channel of the device.

Thus, one or more embodiments may employ materials that may facilitate ballistic transport, such as graphene as well as 2DEGs made of GaAs or GaN compounds: thanks to the characteristics of such materials, the device mode of operation may be determined by a geometry (walls/boundaries/sides) thereof, for example by a relationship between the geometry and the mean free path of the employed material.

BRIEF DESCRIPTION OF SEVERAL VIEWS OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Ballistic conduction may be observed in quasi-1D structures, such as carbon nanotubes or silicon nanowires, as well as in 2D materials such as graphene or gallium arsenide.

For example, it may be possible to form a bi-dimensional (or almost bi-dimensional) electron gas (2DEG or almost 2DEG) layer, that is a layer of electron gas that may be free to move in a bi-dimensional space but may be confined to a very thin layer in the third dimension. Bi-dimensional electron gas layers may be fabricated as substrate for high-electron-mobility transistors HEMTs or may be found as by-products in MOSFETs under certain conditions.

For example, 2D electron gas layers may be found in transistor-like arrangements based on semiconductors: for example, in a MOSFET, a layer of 2D electron gas may be realized underneath a gate oxide of the MOSFET when the MOSFET is in inversion. In such case, electrons in the electron gas below the gate oxide of the MOSFET may be free to travel in trajectories that may be parallel to a surface of the metal oxide.

Bi-dimensional electron gas layers may thus be realized by modulating doping in stacks of materials, e.g., semiconductor heterostructures, that may result in deep and narrow holes of potential wherein the electron gas may be formed. For example, a stack of material may be realized by doping layers of gallium arsenide or gallium nitride with aluminum. Thus, a deep hole of potential may be present at an intermediate surface between a doped portion of the semiconductor and an intrinsic portion of the semiconductor (e.g., at the interface AlGaAs/GaAs or AlGaN/GaN), and the 2D electron gas may be formed by accumulating electrons at such intermediate surface. In case of gallium arsenide, an electron gas 2DEG charge concentration may be about $8.6*10^{11}$ cm$^{-2}$, and an electron mobility may be about 7950 cm$^2$/V*s. In case of gallium nitride, an electron gas 2DEG charge concentration may be about $10^{13}$ cm$^{-2}$, and an electron mobility may be about 900 cm$^2$/V*s.

The electrons that may be confined at the intermediate surface may thus exhibit lower interactions with the lattice of the semiconductor: a decreased (down to null) number of scattering events may result in longer mean free paths for the electrons which in turn may result in a Newtonian-like (i.e., ballistic) behavior for the electrons.

Ballistic devices may be shaped for directing electrons in a certain trajectory by collision with shaped boundaries of the device.

Two-terminal devices exploiting the ballistic behavior of charge were observed, that may behave as conventional rectification diodes having two terminals and similar features. As an example of a ballistic diode, one may refer to Z. Zhu et al.: "Graphene geometric diodes for terahertz rectennas," IOP publishing, Journal of Physics D: applied Physics, 2013. Also, a document "NAND Gate Design for Ballistic Deflection Transistors," Wolpert D. et al., IEEE Transactions on Nanotechnology, Volume 10, Issue 1, January 2011, discloses a NAND gate designed using ballistic deflection transistors (BDTs). However, it was observed that:

the document describes devices including one or more deflecting bodies in the middle of the channel which may be regarded as limitations to an overall simplicity of the structure;

different shapes may be adopted for the electron channel;

the ballistic devices disclosed in the document may include one or more portions continuously connected to a power supply, wherein a current flow is constantly present: accordingly, such devices fail to provide the possibility to discontinue such flow; and deflection (either attraction or repulsion) electrodes may be present in addition to a power supply, that may deviate the electron flow without however blocking it.

Also, it was observed that the document discloses two-terminal devices, whereas in one or more embodiments three-terminal (so-to-say, transistor-like) ballistic devices may be provided, wherein control of the ballistic current flow between two terminals may be implemented by means of a third control terminal.

For the sake of simplicity and ease of understanding, the instant description of one or more embodiments refers to electrons as exemplary particles capable of ballistic transport. Those of skill in the art will otherwise understand that one or more embodiments can apply to other types of particles which exhibit ballistic behavior (e.g., by exhibiting a low, almost null, number of collisions, except at "boundaries" of the device) and which can be deflected by means of a deflecting effector (hereinafter exemplified, in the case of electrons, by an electric field generator). Just by way of non-limiting example, ballistic photons may be exemplary of ballistic particles, which may be launched by a particle source (e.g., a laser) towards a particle sink (e.g., a photoreceptor) through a conducting medium by an adequate source and may be deflected in a tunable way by modulating a dielectric permittivity and/or conductivity at boundaries of the conducting medium, to move the reflecting interface and tune its reflectivity and/or refractive index, for example changing a local charge carrier concentration in a semiconductor material.

Consequently, in the following detailed description of possible exemplary embodiments:

electrons will be exemplary of ballistic particles, an electric field generator will be exemplary of a deflector generating an electric field producing a deflection of electrons, a source electrode will be exemplary of a particle source, and a drain electrode will be exemplary of a particle sink.

In one or more embodiments, the possibility exists to provide ballistic devices, that may behave as electronic switches, wherein the electron flow may be discontinued, and wherein the electron flow may occur between a signal input and a signal output of the device. In case of a ballistic transistor-like device, the channel input and output may be coupled to a source electrode and a drain electrode, respectively, that may not coincide with a power supply.

One or more embodiments may thus relate to ballistic devices that may comprise shaped conductors made of materials with "long" (usually in the range of hundreds of nanometers) mean free paths (mfp). For example, a ballistic device according to one or more embodiments may comprise a shaped electron channel, having a lower width of at least part thereof comparable to the electron mean free path, at least one channel input at which the electrons may enter the electron channel, and at least one channel output at which the electrons exit the electron channel.

In one or more embodiments, an electric field generator may be provided (e.g., a drain and source electrode to which a voltage is applied in case of a ballistic transistor), that may form a first electric field directing the electrons along a pathway, within the electron channel, between the channel input and output, wherein the pathway may be modulated by walls/boundaries/sides of the electron channel, which may or may not be parallel to the electrons' motion dictated by the electric field.

In one or more embodiments, one or more deflection electrodes may be provided (e.g., one or more gate electrodes in case of a ballistic transistor), coupled with the structure e.g., conductively or capacitively, which may apply a deflection electric field having a direction different from the first electric field. The deflection electric field may therefore deviate the electrons from the pathway, and the electrons may either collide or avoid collision with the boundaries/walls of the device, thereby facilitating or penalizing the movement thereof from the input to the output of the electron channel (e.g., from the source to the drain in case of a transistor-like device, with the source and drain path that may comprise the current path of the transistor-like device). Modulating the electron flow by means of a transverse deflection electric field may thus be possible: in case of a ballistic transistor, the electron flow may be modulated by means of the deflection electrode.

In one or more embodiments, the possibility exists to provide an electron channel comprising two outputs: the deflection electrode may be used to direct the electrons in either one of the two outputs, with the outputs being connected to voltage, i.e., respective drain electrodes may be present at either channel output.

In one or more embodiments, the deflection electric field may be applied to the electron channel by means of one or more (e.g., gate) deflection electrodes, that may be coupled to the structure e.g., capacitively or conductively.

For example, in case of capacitive coupling, the deflection electrode may comprise a thin layer of a conductor, such as a metal, that may be separated from the electron channel of the ballistic device by a comparatively narrow gap.

Conversely, in case of conductive coupling, the deflection electrode may be part of the electron channel, and the deflection electrode may be located at the walls of the electron channel. Accordingly, a portion of the electrons passing through the electron channel may flow through the deflection electrode (that may resemble a base of a bipolar junction transistor BJT, even if the underlying physics is different).

Capacitive ("CMOS-like") and conductive ("BJT-like") electrodes may be interchangeable, if the conductive electrodes drain a small current: for example, conductive electrodes may be used to generate high electric fields, with high resistance, such as reversely polarized diodes.

In the FIGS. 1 to 9, one or more examples are disclosed of possible shapes for an electron channel 10 comprised in a ballistic device according to one or more embodiments. For the sake of brevity and simplicity, examples of ballistic transistor-like devices will be disclosed herein, however ballistic transistors are merely non-limiting examples of ballistic devices according to one or more embodiments. In particular:

source S, drain D and gate G electrodes may comprise one or more channel inputs, one or more channel outputs and one or more deflection electrodes, respectively, the first electric field may be generated by a voltage applied to the source S and drain D electrode, the first electric field being aligned to a line (not visible) connecting the two electrodes, and the deflection field may be generated by a voltage applied to the gate electrode G, the direction of the deflection field being different with respect to the direction of the first electric field.

Figure 1:
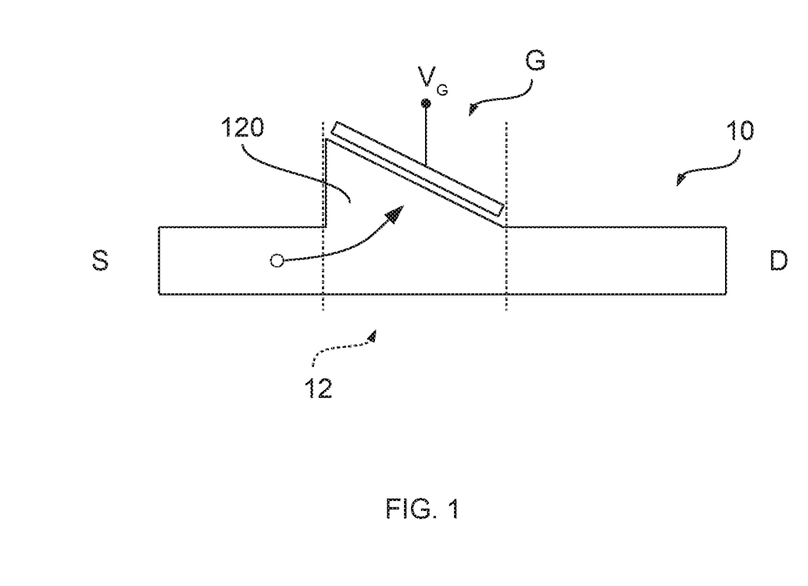
FIGS. 1 to 9 exemplify possible shapes of electron channels of ballistic devices according to one or more embodiments, FIGS. 10 and 11 exemplify cross-sectional views of ballistic devices according to one or more embodiments, FIG. 12 exemplifies features of a ballistic device according to one or more embodiments.
Figure 2:
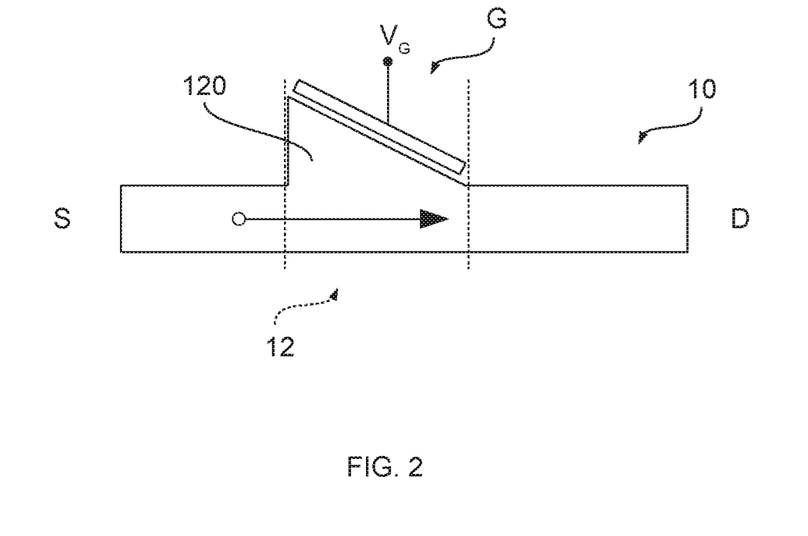

FIGS. 1 and 2 exemplify a ballistic transistor that may be used as a normally open electronic switch.

In one or more embodiments as exemplified in the figures, the electron channel 10 may comprise:

an inflow portion, an end thereof comprising the input source electrode S, an outflow portion, an end thereof, opposite with respect to the end of the inflow portion, comprising the output drain electrode D, and a deflection portion 12, between the inflow and outflow portion, wherein the electron pathway determined by the first electric field may be deviated.

In the present non-limiting example, the inflow portion and the outflow portion of the electron channel 10 may comprise a substantially straight, rectilinear shape that may be aligned to the direction of the first electric field. Conversely, the deflection portion 12 of the electron channel 10 may comprise a protrusion 120 from the rectilinear shape, that may extend from a wall of the electron channel 10 (optionally along the entire length of the deflection portion 12) in a direction transverse with respect to the direction of the first electric field and the shape of the inflow/outflow portions of the electron channel 10. In the present non-limiting example, the protrusion 120 may comprise a right triangle, having its right angle towards the inflow portion of the channel 10, i.e., towards the source electrode S. That is, the protrusion 120 may taper towards the outflow portion.

Accordingly, the electron channel 10 may comprise a first wall and an opposite second wall, the first wall comprising a straight line, and the second wall comprising a straight line interrupted, at the deflection portion 12, by walls of the protrusion 120.

The gate electrode G may be arranged at (that is, in close proximity to) one or more walls of the protrusion 120 of the deflection portion 12, with the gate electrode G having a surface aligned with the wall(s) of the protrusion 120. In the present non-limiting example, the gate electrode G may be arranged at (in close proximity to) and parallel to the hypotenuse of the right triangle.

In one or more embodiments, thanks to the protrusion 120, the electron channel 10 may have a width, at the deflection portion 12, larger than a width of the electron channel 10 at the inflow portion and at the outflow portion.

If a voltage $V_G$ is applied to the gate electrode G, e.g., a positive voltage, the electrons within the electron channel 10 may be deviated from the pathway generated by the first electric field, and may be collected at the protrusion 120. Accordingly, the electrons may fail to reach the output drain electrode D and the ballistic transistor may be in an off, non-conductive state. The behavior of the electrons in the electron channel 10 of the ballistic transistor being in the off state may be exemplified, in FIG. 1, by an arrow.

Conversely, if no voltage is applied to the gate electrode G, the electrons within the electron channel 10 may substantially follow the pathway generated by the first electric field. Accordingly, the electrons may reach the output drain electrode D and the ballistic transistor may be in an on, conductive state. The behavior of the electrons in the electron channel 10 of the ballistic transistor being in the on state may be exemplified, in FIG. 2, by an arrow.

For example, if the voltage $V_G$ applied to the gate electrode G has an intermediate value, that is the transistor may lie between the on state and the off state, the electron flow may be partially blocked and may partially reach the output drain electrode D of the transistor, like a resistor, or a variable resistor, or a controlled resistor.

Figure 3:
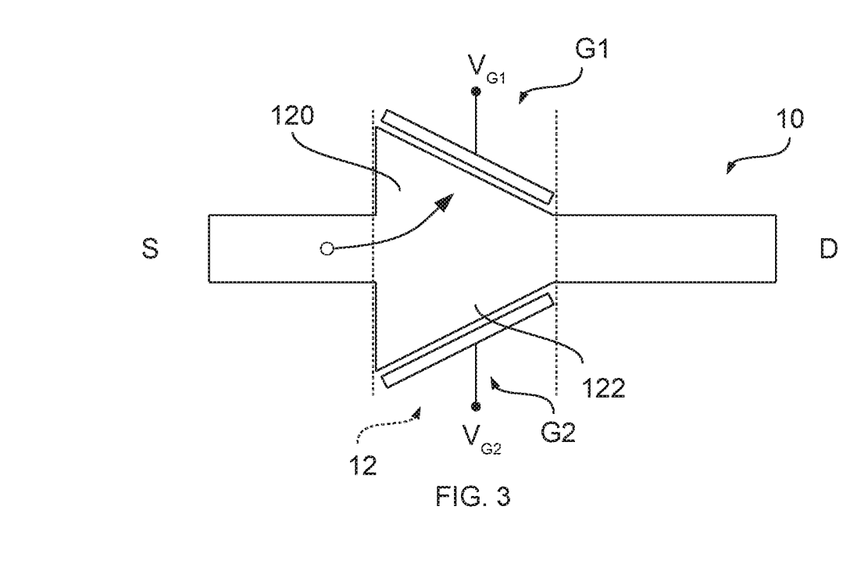
Figure 4:
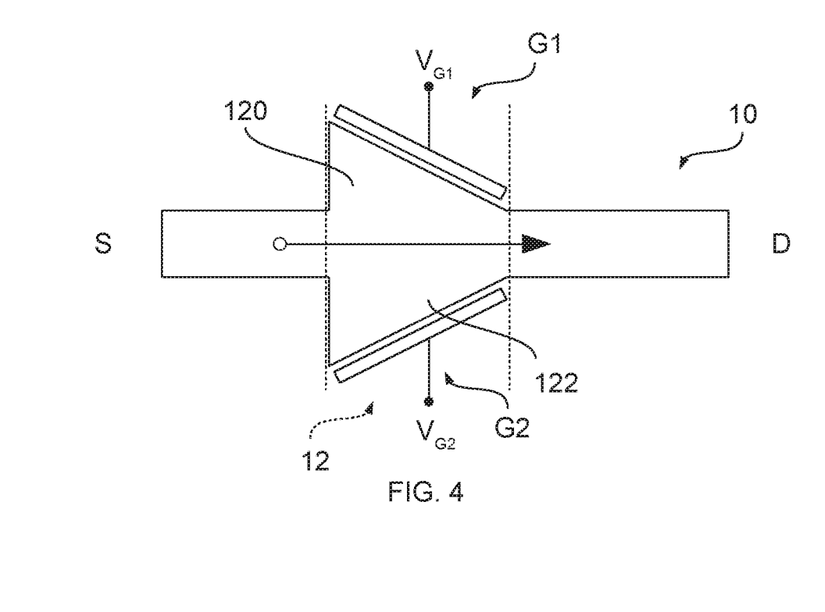

FIGS. 3 and 4 exemplify the possibility of providing first and second protrusions 120, 122 at opposite walls of the electron channel 10, at the deflection portion 12 thereof, the electron channel 10 being similar to the one described with respect to FIGS. 1 and 2.

In the present non-limiting example, the first protrusion 120 may correspond to the protrusion 120 of FIGS. 1 and 2, whereas the second protrusion 122 may differ in that it may be formed, at the deflection portion 12, in the opposite wall of the electron channel 10 and may be specularly symmetrical (in respect of the first electric field) to the protrusion 120 of FIGS. 1 and 2.

Accordingly, in one or more embodiments as exemplified in FIGS. 3 and 4, the electron channel 10 may comprise a first wall and an opposite second wall, the first wall comprising a straight line interrupted, at the deflection portion 12, by walls of the first protrusion 120, and the second wall comprising a straight line interrupted, at the deflection portion 12, by walls of the second protrusion 122.

In one or more embodiments, a first G1 and second G2 gate electrode may be arranged at the deflection portion 12, e.g., at one or more walls of the first 120 and second 122 protrusion, respectively, in close proximity to the wall(s) and with a surface aligned thereto. In the present non-limiting example, the gate electrodes G1 and G2 may be arranged at (e.g., in close proximity to) and parallel to the hypotenuses of the right triangles of the first 120 and second 122 protrusion. Again, thanks to the first protrusion 120 and the second protrusion 122, the electron channel 10 may have a width at the deflection portion 12 larger than a width of the electron channel 10 at the inflow portion and at the outflow portion.

As a result of a (e.g., positive) voltage $V_{G1}$ resp. $V_{G2}$ being applied to the first G1 resp. second G2 gate electrode, the electrons within the electron channel 10 may be deviated from the pathway generated by the first electric field, and may be collected at (e.g., impinge on) the first 120 resp. second 122 protrusion. Accordingly, the electrons may fail to reach the output drain electrode D and the ballistic transistor may be in an off, non-conductive state. The behavior of the electrons in the electron channel 10 of the ballistic transistor being in the off state may be exemplified by an arrow in FIG. 3.

As a result of no voltage being applied to the first G1 and second G2 gate electrode, the electrons within the electron channel 10 may substantially follow the pathway generated by the first electric field and may reach the output drain electrode D. If the same voltage is applied to the first G1 and second G2 gate electrodes, the electrons may follow the pathway generated by the first electric field, however the electrons may be accelerated and may reach the drain electrode D faster with respect to the case if no voltage is applied. In fact, the second gate electrode G2 may be added to accelerate electrons (or more in general carriers): accordingly, it may facilitate improving RF performances of the ballistic device. As a result of different voltages $V_{G1}$, $V_{G2}$ applied to the first G1 and second G2 gate electrodes, the pathway of the electrons may depend on a balance between these different voltages. For example, depending on sign and magnitude of the first $V_{G1}$ and second $V_{G2}$ voltages, that in turn may depend on the electron flow deviation that may be desired:

the electron flow may be blocked (e.g., the electrons may be collected at (e.g., impinge on) the first 120 resp. second 122 protrusion of the deflection portion 12), for example as a result of both voltages being positive voltages;

the electron flow towards the outflow portion may the electron flow is affected (partially blocked, partially facilitated, or accelerated), as a function of relative magnitude and verse of both respective electric fields applied;

the effect of the first G1 and second G2 electrodes may be different, for example the first electrode G1 may block a part of the electron flow and the second electrode G2 may (partly) facilitate another part of the electron flow towards the outflow portion.

Accordingly, in these cases, the ballistic transistor may be in an on, conductive state. The behavior of the electrons in the electron channel 10 of the ballistic transistor being in the on state may be exemplified by the arrow in FIG. 4.

In the following figures, parts or elements like parts or elements already discussed in connection with FIGS. 1 to 4 are indicated with like references and a corresponding detailed description will not repeated for the sake of brevity.

Figures 5, 6:
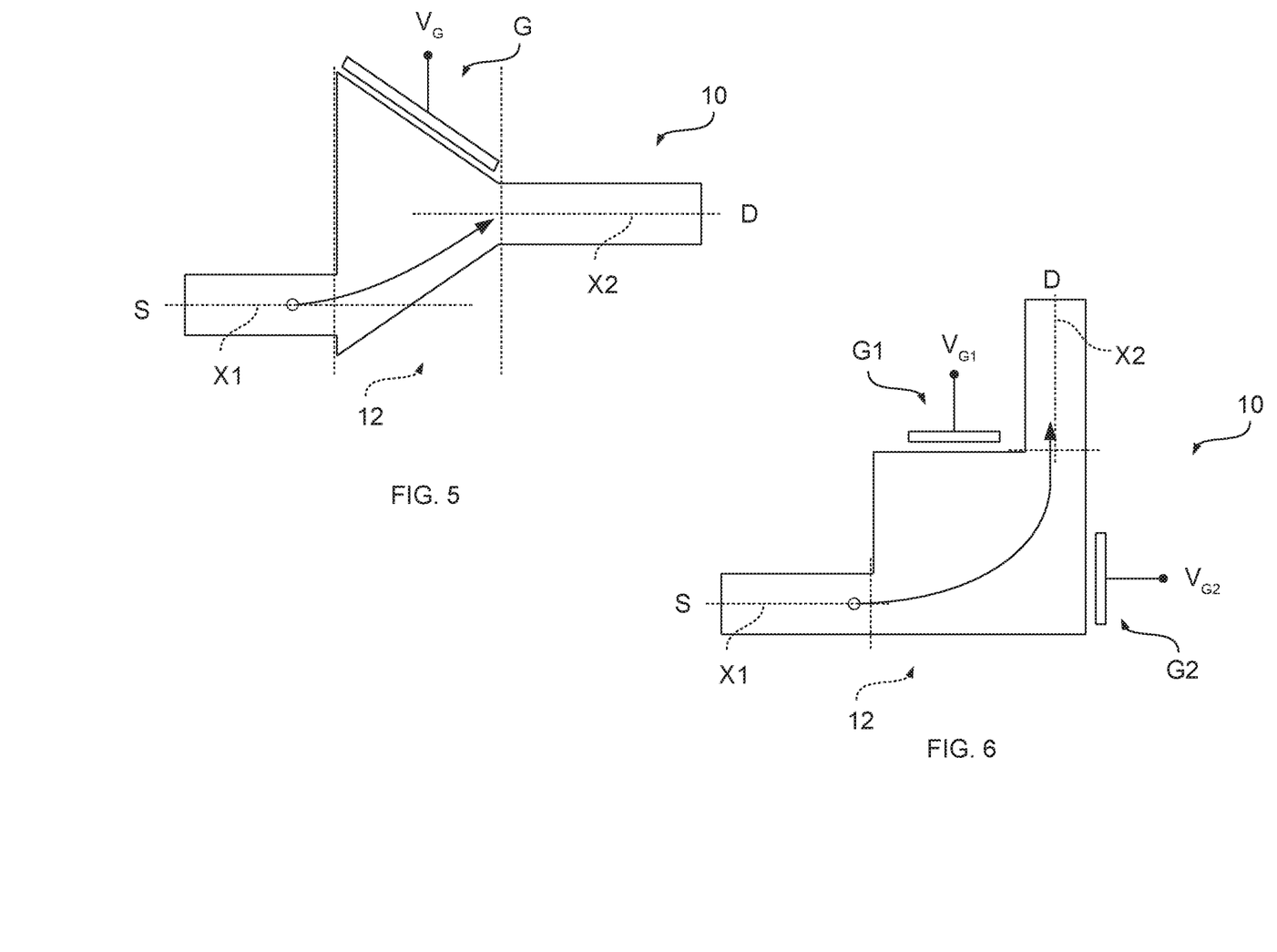

In one or more embodiments, as exemplified in FIG. 5, the electron channel 10 may comprise:

an inflow portion, substantially rectilinear, that may develop along a first direction X1, an outflow portion, substantially rectilinear, that may develop along a second direction X2, the second direction X2 being parallel and non-superimposing with respect to the first direction X1, and a deflection portion 12, that may lie between the inflow portion and the outflow portion.

In one or more embodiments, as exemplified in FIG. 5, the shape of the deflection portion 12 may comprise a trapezoid, wherein the outflow portion may be connected to a short base of the deflection portion 12, that may have dimension equal to a width of the outflow portion, and wherein the inflow portion may be connected to a long base of the deflection portion 12, away from a center of the long base. Accordingly, the walls of the deflection portion 12 may taper towards the outflow portion.

In one or more embodiments, as exemplified in FIG. 5, a gate electrode may be arranged at (in close proximity to) a leg of the trapezoidal deflection portion 12 that may be furthest from the inflow portion.

It will otherwise be appreciated that the shown embodiments are merely exemplary in nature, and one or more features of the gate electrodes may be modified without modification of the underlying inventive concept. For example, the control gate electrodes G, G1, G2 may be arranged at the deflection portion 12 as a function of the desired deflection that the electrons are configured to perform. The same may also apply to the voltages $V_G$, $V_{G1}$, $V_{G2}$ applied thereto, that may be chosen as a function of the deflection path desired for the electrons within the electron channel 10. In other words, a positive resp. negative voltage $V_G$ may be applied to the gate electrode G if it is desired that the electrons deflect towards resp. away from the gate electrode G. Accordingly, for example with reference to FIG. 5, the possibility exists to arrange, in place of the gate electrode G (or in addition thereto), a different gate electrode (not visible) at an opposite leg of the trapezoidal deflection portion 12 with respect to the shown gate electrode G. To obtain a deflection similar to the deflection obtainable with the gate electrode G positively biased, a negative voltage ($-V_G$) may be applied to the different, opposite gate electrode (not visible).

Accordingly, if no voltage is applied to the gate electrode and since the inflow and outflow portion develop along different, non-superimposing lines, the electrons may fail to pass from the inflow portion to the outflow portion and may remain constrained in the deflection portion 12. Conversely, if a (e.g., positive) voltage is applied to the gate electrode, the electrons may deviate towards the gate electrode, and therefore the electrons may be facilitated by the gate electrode to reach the outflow portion. The behavior of the electrons in the electron channel 10 of the ballistic transistor if the voltage is applied to the gate electrode may be exemplified by an arrow in FIG. 5.

In one or more embodiments, as exemplified in FIG. 6, the electron channel 10 may comprise:
an inflow portion, substantially rectilinear, that may develop along a first direction X1,
an outflow portion, substantially rectilinear, that may develop along a second direction X2, the second direction X2 being transverse to the first direction X1, and
a deflection portion 12, having a rectangular shape, that may lie between the inflow portion and the outflow portion, with the first X1 and second X2 direction being parallel to sides of the rectangle.

In one or more embodiments, as exemplified in FIG. 6, the inflow portion may be coupled to a first side of the rectangular deflection portion 12, close to a first corner thereof, and the outflow portion may be coupled to a second side of the rectangular deflection portion 12, close to a second corner, the second corner opposite to the first corner.

In one or more embodiments, a first gate electrode G1 may be placed at the second side of the rectangular deflection portion 12, away from the second corner and side by side with the outflow portion, and a second gate electrode G1 may be placed at a third side of the rectangular deflection portion 12, opposite to the second side, away from the second corner.

Accordingly, if no voltage is applied to the gate electrodes G1, G2 and since the inflow and outflow portion develop along different, transverse lines, the electrons may fail to pass from the inflow portion to the outflow portion and may remain constrained in the deflection portion 12. Conversely, if a first and a second (e.g., positive) voltage are applied to the gate electrodes G1, G2, the electrons may be facilitated by the gate electrodes to reach the outflow portion. For example, the first and second voltage may be chosen so that they combine to steer the electrons along an intended trajectory between the inflow portion to the outflow portion. The behavior of the electrons in the electron channel 10 of the ballistic transistor if the first and second voltage are applied to the gate electrodes G1, G2 may be exemplified by an arrow in FIG. 6.

Figure 7:
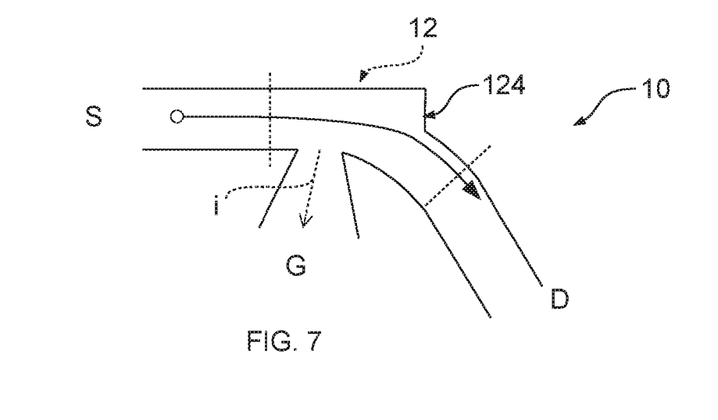

In one or more embodiments, as exemplified in FIG. 7, the electron channel 10 may comprise a curved shape, wherein the inflow portion and the outflow portion may have different directions and the deflection portion may be curved so that it may connect the inflow portion and the outflow portion. Also, the deflection portion 12 may be shaped so that a wall thereof may lie normal to a pathway of the flow of e.g., high-speed ballistic electrons, the wall of the deflection portion forming a blocking boundary 124. The e.g., high-speed electrons may not be able to bend their trajectory towards the outflow portion and may be reflected by the blocking boundary 124 of the deflection portion 12.

In one or more embodiments, the electron channel 10 may comprise a side channel at one wall of the deflection portion 12, coupled at one end to the gate electrode G. The side channel may extend away from the deflection portion and may taper towards the walls of the deflection portion 12 itself. One or more embodiments may thus comprise a conductive, high resistance gate that may deflect the trajectory of the electrons and by also draining a small current i, in a manner that may resemble a reverse biased ballistic diode as discussed previously.

Again, if a (e.g., positive) voltage is applied to the gate electrode G, the electrons may deviate towards the gate electrode and away from the blocking boundary 124, and therefore the electrons may be facilitated by the gate electrode G to reach the outflow portion. The behavior of the electrons in the electron channel 10 of the ballistic transistor if the voltage is applied to the gate electrode G may be exemplified by an arrow in FIG. 7.

Figure 8:
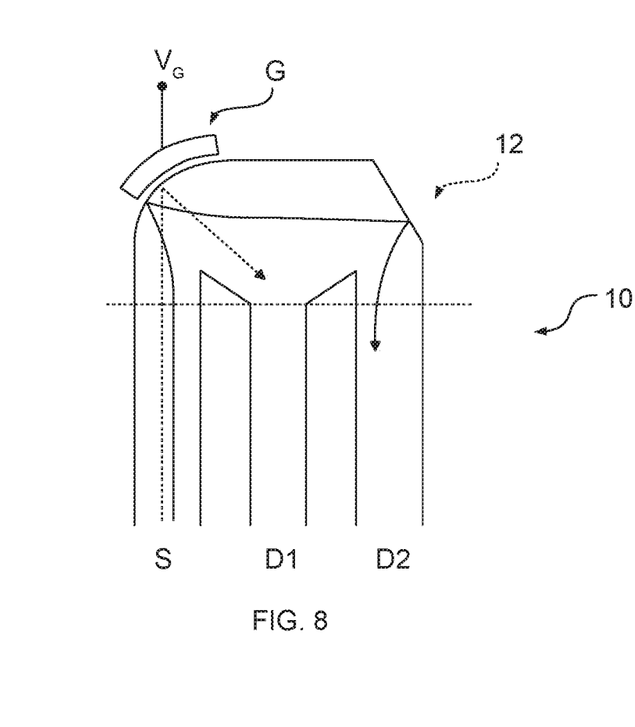

In one or more embodiments, as exemplified in FIG. 8, the electron channel 10 may comprise an inflow portion, a first outflow portion and a second outflow portion, that may have a rectilinear shape and may be arranged parallel to each other (non-superimposing to one another). The inflow portion plus the first and second outflow portion may be connected at one end to the deflection portion 12 and at another end to a source electrode S plus first D1 and second D2 drain electrodes, respectively. The electron current path may comprise a single source and optionally multiple sinks as exemplified herein.

In one or more embodiments, the gate electrode G may be arranged at the deflection portion at the wall opposite with respect to the inflow portion, plus first and second outflow portion, optionally away from the first and the second outflow portion.

For example, the deflection portion 12 may comprise at least partially a parabolic shape, so that:
if no voltage is applied to the gate electrode G, the electrons may be directed by the geometry of the deflection portion 12, i.e., by walls thereof, towards the first drain electrode D1, e.g., a concentrator at a focus point of the parabola, and
if a (e.g., positive) voltage is applied to the gate electrode G, the electrons may be directed by the geometry of the deflection portion 12 as well as by the deflection electric field towards the second drain electrode D2, away from the first drain electrode D1.

In FIG. 8, the behavior of the electrons in the electron channel 10 of the ballistic transistor if no voltage is applied to the gate electrode may be exemplified by a dashed arrow, whereas the behavior of the electrons in the electron channel 10 of the ballistic transistor if voltage is applied to the gate electrode may be exemplified by a full arrow. Accordingly, the electrons may follow a parabolic trajectory, at least in a portion of the electron channel 10, if voltage is applied to the gate electrode G.

Figure 9:
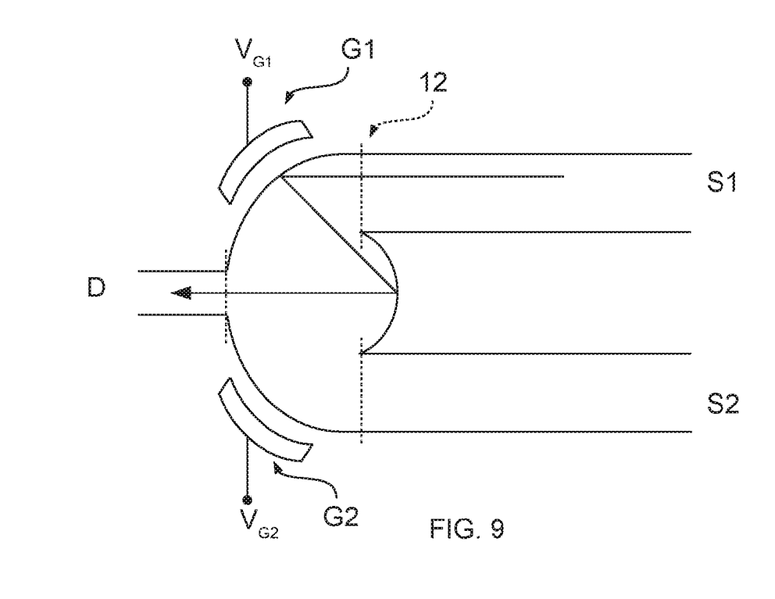

In one or more embodiments, as exemplified in FIG. 9, a generalization of a ballistic parabolic concentrator is represented. The electron channel 10 may comprise:

a first rectilinear inflow portion, that may be coupled, at one end, to a first end of a first side of the deflection portion 12 of the electron channel 10, and at another end to a first source electrode S1, an optional second rectilinear inflow portion, that may be coupled, at one end, to a second end, opposite to the first end, of the first side of the deflection portion 12, and at another end to an optional second source electrode S2, and a rectilinear outflow portion, that may be coupled, at one end, to a center of a second side of the deflection portion 12, opposite to the first side thereof, and, at another end, to a drain electrode D.

The first and second (if present) inflow portion as well as the outflow portion may have parallel, non-superimposing directions, with the outflow portion lying between the first and second inflow portion. As exemplified herein, the electron current path may thus comprise multiple sources and a single sink.

A first G1 and, optionally, a second G2 (e.g., capacitive) gate electrode may be arranged at the second side of the deflection portion 12, on either side of the outflow portion.

The second side of the deflection portion 12 may have a parabolic shape, with the outflow portion being arranged at the vertex of the parabola and the first and second gate electrodes G1, G2 being arranged at the curved portions thereof. The first side may comprise a first and second straight portion that may be coupled to the first and second inflow portion, and a further parabolic formation, lying between the first and second inflow portion.

Accordingly, the deflection portion 12 may have a double parabolic geometry, so that:

if no voltage is applied to the gate electrodes G1, G2, the electrons may be directed by the geometry of the deflection portion 12, i.e., by walls thereof, towards the outflow portion, if a (e.g., positive) voltage is applied to the first gate electrode G1, the electrons, sourcing from the first inflow portion, may be directed, by the geometry of the deflection portion 12 as well as by the deflection electric field, away from the outflow portion, and if a (e.g., positive) voltage is applied to the second gate electrode G2, the electrons, sourcing from the second inflow portion, may be directed, by the geometry of the deflection portion 12 as well as by the deflection electric field, away from the outflow portion.

Figure 10:
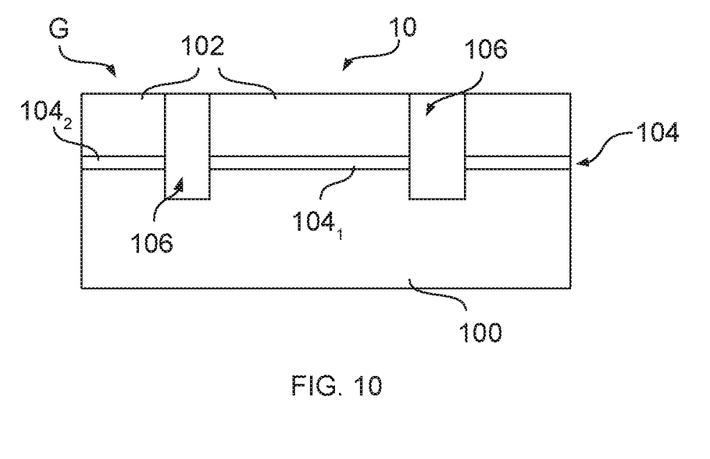
Figure 11:
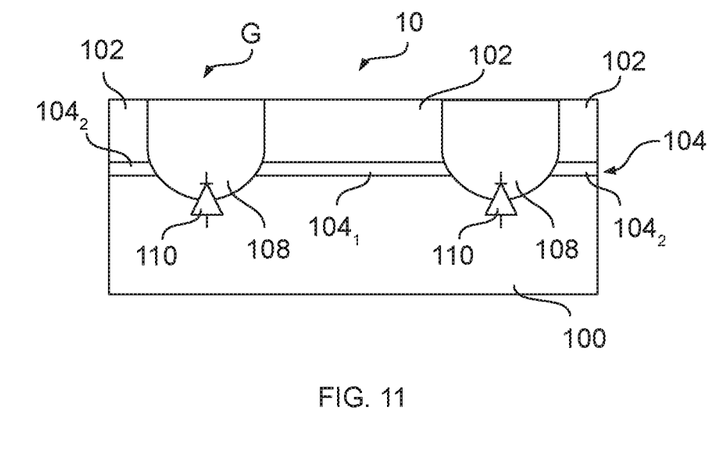

The following FIGS. 10 and 11 exemplify possible cross-sectional views of ballistic devices according to one or more embodiments.

In one or more embodiments, the ballistic device may be formed in a semiconductor heterostructure, that is a stack of materials that may form a uniform bidimensional electron gas (2DEG) therein.

A two-layered heterostructure will be described herein as a non-limiting example. It will be otherwise understood that one or more embodiments may comprise heterostructures having more than two layers, e.g., structures wherein each of the first 100 and second 102 layer may comprise one or more semiconductors.

With reference to FIGS. 10-11, the heterostructure may comprise a first layer 100 of an intrinsic semiconductor, e.g., gallium arsenide or gallium nitride, and a second layer 102 of a doped semiconductor, e.g., aluminum-doped gallium arsenide or gallium nitride, with a uniform bidimensional electron gas (2DEG) 104 that may form at an interface between the first layer 100 and the second layer 102.

The ballistic device may be formed by insulating a portion of the 2DEG, e.g., a central portion $104_1$, from a surrounding 2DEG, that may be obtained employing different techniques, for example the ballistic device may be shaped by etching the heterostructure, as exemplified in FIG. 10, or by (e.g., deeply) doping portions of the heterostructure surrounding the ballistic device, as exemplified in FIG. 11. These techniques may result in etched portions 106 and/or doped portions 108 that may insulate/confine a portion of the 2DEG $104_1$.

With reference to FIG. 10, the ballistic device may be shaped for example by etching around the electron channel 10:

leaving the second layer 102 only at the electron channel 10, or etching only around the electron channel 10 and the electrodes, leaving trenches around these components that may insulate the electron channel 10 and the electrodes.

The etched portions 106 may form a trench that may run around and define the shape of the electron channel 10, i.e., the walls thereof, while a central non-etched portion may comprise the electron channel 10. Also, further etched portions (not visible) may be present that may insulate the peripheral non-etched portions from each other.

In one or more embodiments, a plurality of ballistic devices may be formed within the same heterostructure. Accordingly, the plurality of ballistic devices (as well as the electrodes and electron channels thereof) may be insulated from each other e.g., using Deep Trench Isolation (DTI).

In one or more embodiments, the etching may be performed so that only the second layer 102 is etched, or so that at least the second layer 102 is etched, i.e., it may be possible to discontinue etching when also a portion of the first material 100 is etched. Accordingly, the ballistic device may be shaped by digging the semiconductor heterostructure at least to the interface between the first layer 100 and the second layer 102, to insulate portion of the device from its surrounding, e.g., forming a shaped electron channel. This may be achieved using any suitable technique that may exhibit a resolution of tens up to hundreds of nanometers (e.g., anisotropic etching, Bosch etching, Inductively Coupled Plasma (ICP), or deep Reactive Ion Etching (ME), with an Electron Beam Lithography (EBL)-defined mask).

For example, as exemplified in FIG. 10, the etched portions 106 of the heterostructure may have a thickness higher than or substantially equal to a thickness of the second layer 102. Also, the etched portions 106 may be optionally filled with electrically-insulating material.

Accordingly, thanks to the etched portions 106, the 2DEG 104, at the non-etched portions of the ballistic device, may be confined in the central portion $104_1$ comprising the electron channel 10, and in one or more peripheral portions $104_2$.

In one or more embodiments, as exemplified in FIG. 10, the illustrated gate electrode G may be formed employing one peripheral portion $104_2$ of the 2DEG 104.

Conversely, in one or more embodiments, the possibility exists to:

etch around the shape of the electron channel 10, form the (e.g., capacitive) electrodes of the ballistic device e.g., by growth or deposition of electrically-conductive material such as metal, and optionally applying electrically-insulating material, e.g., a dielectric, between the gate electrode(s) and the electron channel 10.

In one or more embodiments, a diode (such as a P-N or Zener diode) may be formed at the walls of the electron channel 10. As exemplified in FIG. 11, such diode may be formed by doping the heterostructure to build the (e.g., deep) doped portions 108 adjacent to, e.g., in contact with, the walls of the electron channel 10. The doped portions 108 may have a thickness higher than the thickness of the second layer 102, thereby the doped portions 108 may be configured to confine the central portion $104_1$.

In one or more embodiments, at least a part of one or more of these doped portions 108 may be optionally used as a gate electrode G, G1, G2, by applying a voltage to create a deflection electric field in the deflection portion 12. It will be appreciated that in an actual device according to one or more embodiments, one or more parasitic diodes may be present, for example diodes 110 active between the first layer 100 and the doped portions 108, as shown in FIG. 11.

Figure 12:
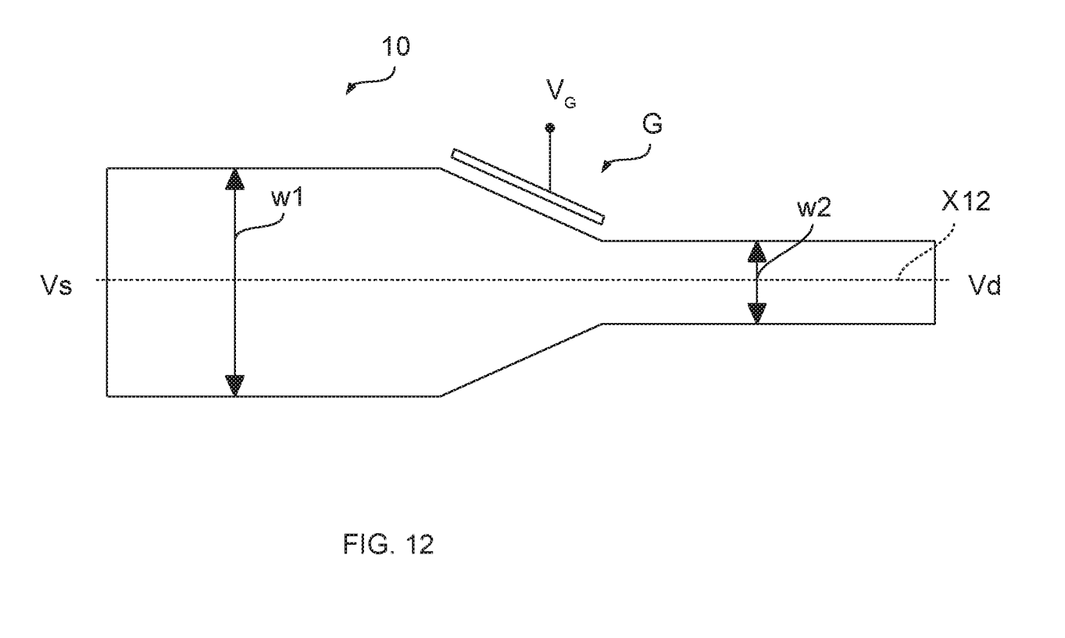

In one or more embodiments, the electron channel 10 of the electronic ballistic device may have a shape represented in FIG. 12. The inflow portion may have a rectilinear shape and a width w1, that may be higher than a width w2 of the outflow portion of the electron channel 10. Also, the inflow and outflow portion may be centered along a common axis X12.

The intermediate deflection portion 12 may connect the inflow portion and the outflow portion, and the walls of the deflection portion 12 may taper towards the outflow portion.

In one or more embodiments, the dimensions and shape of the ballistic device may depend on the mean free path (mfp) of the electrons within the electron channel 10: the ballistic device electron channel 10 may be chosen so that the dimensions thereof may be comparable to the dimensions of the mean free path.

For example, considering a mean free path for the electrons of about 400 nm, the width w1 of the inflow portion may be about 400 nm, whereas the width w2 of the outflow portion may be about 200 nm. Also, the possibility exists of providing the electron channel 10 with a width w1 that may be higher than the electron mean free path (mfp), however, the ballistic device efficiency may decrease and quasi-ballistic transport may be obtained. If the width w1 of the electron channel 10 is higher than the electron mean free path (mfp), scattering events with the lattice of the heterostructure may occur, possibly in a limited amount. Accordingly, the width w1 of the electron channel 10 may be chosen as a function of the relevance of the collisions of the electrons with the walls of the electron channel 10, that is the width w1 may be chosen as a function of the number of scattering events within the electron channel 10 with respect to the number of collisions with the walls of the electron channel 10.

Also, it will be appreciated that the voltage as shown in FIG. 12 (and, more generally, the voltage applied to the gate electrode G in the various embodiments as exemplified throughout the figures) can be produced by a voltage source compatible for use in a structure as shown. A capacitor may be exemplary of such structure.

One or more embodiments may involve a judicious choice of the channel size, by taking into account desirable values for the mean free path (mfp), e.g., as a function of the material chosen, so that a different mean free path may lead to a different choice of the channel size.

While precise relationships between the threshold voltage, size, and geometry may not be easily expressed by simple analytical relationships, the possibility exists in one or more embodiments of obtaining low (nearly zero) thresholds.

One or more embodiments may thus relate to a (e.g., three-terminal, ballistic or quasi-ballistic) device, that may comprise:

a particle propagation channel (e.g., 10) facilitating ballistic transport of particles (e.g., electrons and/or photons) from at least one particle inflow portion to at least one particle outflow portion, the particle propagation channel comprising a particle flow deflection portion (e.g., 12) between the at least one inflow portion and the at least one outflow portion, at least one particle deflector (e.g., G, G1, G2) arranged at the particle flow deflection portion, the at least one particle deflector activatable to deflect particles propagating in the flow deflection portion, the at least one particle deflector admitting at least one state (e.g., as a result of the deflector being active) wherein the particle flow through the device may fail to reach the particle outflow portion, and a particle source (e.g., S) at the at least one particle inflow portion of the particle propagation channel, and a particle sink (e.g., D) at the at least one particle outflow portion of the particle propagation channel, wherein the particle source and the particle sink may provide at least one particle current path through the device.

In one or more embodiments, the particle propagation channel may have a rectilinear trajectory at the particle flow deflection portion, wherein the at least one particle deflector may be arranged at the particle flow deflection portion to deflect particles away from the at least one particle outflow portion in the at least one state of the particle deflector (e.g., as a result of the deflector being active).

In one or more embodiments, the particle propagation channel may comprise at least a protrusion (e.g., 120, 122) at the particle flow deflection portion, wherein if the at least one particle deflector is in the at least one state (e.g., as a result of the deflector being active), the particle flow through the device may be collected at (e.g., impinges on) the at least one protrusion and may fail to reach the at least one outflow portion.

The device according to one or more embodiments may comprise:

a first protrusion (e.g., 120) and a second protrusion (e.g., 122) in the particle propagation channel at opposite sides of the particle flow deflection portion (12), a first particle deflector (e.g., G1) and a second particle deflector (e.g., G2) at the first protrusion and at the second protrusion, respectively.

The first and second particle deflector may admit the at least one state and at least one further state, whereby:

as a result of the first particle deflector being in the at least one state (i.e., only one deflector being active), the particle flow through the device may be collected at (e.g., impinges on) the first protrusion and may fail to reach the particle outflow portion, as a result of the second particle deflector being in the at least one state (i.e., only one deflector being active), the particle flow through the device may be collected at (e.g., impinges on) the second protrusion and may fail to reach the particle outflow portion, and as a result of both the first and second particle deflector being in the at least one further state (i.e., being both inactive or both active), the particle flow through the device may reach the particle outflow portion, optionally accelerated.

For example, in case of electron ballistic transport, the electrons may be affected depending on relative magnitude and verse of respective deflection electric field generated by respective electric field generators: in particular, if the deflection electric fields have about same magnitude and opposite verse, an acceleration of the electrons through the device may be possible.

In one or more embodiments, the particle propagation channel may have a curved trajectory at the particle flow deflection portion, wherein the at least one particle deflector may be arranged at the particle flow deflection portion and may admit the at least one state (e.g., as a result of the particle deflector being inactive) and at least one further state (e.g., as a result of the particle deflector being active), wherein the particle deflector may deflect particles towards the at least one particle outflow portion in the at least one further state.

In one or more embodiments, the at least one particle deflector may comprise an electrode arranged at a side of the particle flow deflection portion, optionally along the entire length of such side.

In one or more embodiments:

the particle propagation channel may comprise an electron propagation channel, the at least one particle deflector may comprise at least one electric field generator generating a deflecting electric field, the particle source may comprise a source electrode, and the particle sink may comprise a drain electrode.

In one or more embodiments, the at least one electric field generator may be coupled to the electron propagation channel (10) conductively or capacitively.

In one or more embodiments, the electron propagation channel may have a width (w1, w2), along the electron propagation channel, that may be comparable with respect to a mean free path of the electrons flowing in the electron propagation channel, that is slightly larger, equal to, or slightly less than the mean free path.

One or more embodiments may relate to a solid-state component comprising a device according to one or more embodiments. The component may comprise:

a solid-state structure (e.g., 100, 102, 104) providing the particle propagation channel having the at least one particle inflow portion, the at least one particle outflow portion and the particle flow deflection portion, the at least one particle deflector arranged at the particle flow deflection portion, and the particle source (S) as well as the particle sink.

In one or more embodiments, the solid state structure may comprise a semiconductor heterostructure, optionally an etched heterostructure.

In one or more embodiments, the electronic component may comprise insulating material between the particle propagation channel and the at least one gate applying a deflection.

In one or more embodiments, the electronic component may comprise at least one diode formed between the particle propagation channel and a surrounding material, the particle propagation channel insulated from the surrounding material by a doped region being a result of the at least one diode.

In one or more embodiments, at least two devices may be directly connected between them (for example in series or in parallel) and then source electrode and/or drain electrode may be absent.

Without prejudice to the underlying principles, the details and embodiments may vary, even significantly, with respect to what has been disclosed by way of example only, without departing from the extent of protection.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a particle propagation channel including:
      a particle inflow portion,
      a particle outflow portion, and
      a particle flow deflection portion between the particle inflow portion and the particle outflow portion, the particle propagation channel being configured to facilitate ballistic transport of particles from the particle inflow portion to the particle outflow portion, the particle flow deflection portion including a first protrusion that protrudes outwardly with respect to the particle inflow portion;
   a first particle deflector arranged outside of an outer surface of a wall of the first protrusion of the particle flow deflection portion, the first particle deflector being activatable to deflect particles propagating in the particle flow deflection portion toward an inner surface of the wall of the first protrusion and prevent the particles from reaching the particle outflow portion; and
   a particle source at the particle inflow portion of the particle propagation channel, and a particle sink at the particle outflow portion of the particle propagation channel, wherein the particle source and the particle sink are configured to cause a current path of the particles through the device.

2. The device of claim 1, wherein the particle propagation channel has a rectilinear trajectory at the particle flow deflection portion, wherein the particle deflector is arranged at the particle flow deflection portion to selectively deflect particles away from said particle outflow portion.

3. The device of claim 1, wherein the first particle deflector is configured to selectively cause the particles to be collected at the first protrusion instead of reaching the particle outflow portion.

4. The device of claim 1, comprising:
   a second protrusion in the particle propagation channel at an opposite side of the particle flow deflection portion as the first protrusion,
   a second particle deflector at the second protrusion, wherein:
   the first particle deflector is at the first protrusion,
   each of said first particle deflector and said second particle deflector is selectively activatable into a first state and a second state,
   the first particle deflector, when in said first state, causes the particles to be collected at the first protrusion instead of reaching the particle outflow portion, the second particle deflector, when in said first state, causes the particles to be collected at the second protrusion instead of reaching the particle outflow portion, and when both of the first and second particle deflectors are in said second state, the particles flow through the particle propagation channel and reach the particle outflow portion.

5. The device of claim 1, wherein the particle propagation channel has a curved trajectory at the particle flow deflection portion, wherein the first particle deflector is selectively activatable into a first state, in which the first particle deflector prevents the particles from reaching the particle outflow portion and a second state, in which the first particle deflector deflects the particles towards said particle outflow portion.

6. The device of claim 1, wherein:
the particle propagation channel comprises an electron propagation channel facilitating ballistic transport of electrons,
the first particle deflector comprises an electric field generator configured to generate a deflecting electric field,
the particle source comprises a source electrode, and
the particle sink comprises a drain electrode.

7. The device of claim 6, wherein the electric field generator is an electrode configured to have a voltage applied thereto, the electrode being arranged at a side of the particle flow deflection portion.

8. The device of claim 6, wherein the electric field generator is coupled to the electron propagation channel conductively or capacitively.

9. The device of claim 6, wherein the electron propagation channel has a width that is comparable with a mean free path of electrons flowing in the electron propagation channel when the device is activated.

10. A solid-state electronic component, comprising:
a solid-state structure providing a particle propagation channel that includes:
a particle inflow portion,
a particle outflow portion, and
a particle flow deflection portion between the particle inflow portion and the particle outflow portion, the particle propagation channel being configured to facilitate ballistic transport of particles from the particle inflow portion to the particle outflow portion, the particle flow deflection portion including a protrusion that protrudes outwardly with respect to the particle inflow portion;
a first particle deflector arranged outside of a wall of the protrusion of the particle flow deflection portion, the first particle deflector being activatable to deflect particles propagating in the particle flow deflection portion toward the wall of the protrusion and prevent the particles from reaching the particle outflow portion; and
a particle source at the particle inflow portion of the particle propagation channel, and a particle sink at the particle outflow portion of the particle propagation channel, wherein the particle source and the particle sink are configured to cause a current path of the particles through the solid-state structure.

11. The electronic component of claim 10, wherein the solid-state structure comprises a semiconductor heterostructure.

12. The electronic component of claim 10, comprising insulating material between the particle propagation channel and the first particle deflector.

13. The electronic component of claim 10, comprising a diode formed between the particle propagation channel and a surrounding material, the particle propagation channel being insulated from the surrounding material by a doped region of said diode.

14. The electronic component of claim 10, wherein the particle propagation channel has a rectilinear trajectory at the particle flow deflection portion, wherein the particle deflector is arranged at the particle flow deflection portion to selectively deflect particles away from said particle outflow portion.

15. The electronic component of claim 10, wherein the first particle deflector is configured to selectively cause the particles to be collected at the protrusion instead of reaching the particle outflow portion.

16. A device, comprising:
an electron propagation channel including:
an electron inflow portion,
an electron outflow portion, and
an electron flow deflection portion between the electron inflow portion and the electron outflow portion, the electron propagation channel being configured to facilitate ballistic transport of electrons from the electron inflow portion to the electron outflow portion, the electron flow deflection portion including a first protrusion that protrudes outwardly with respect to the electron inflow portion;
a first gate electrode arranged outside of an outer surface of a wall of the first protrusion of the electron flow deflection portion, the first gate electrode being activatable to deflect electrons propagating in the electron flow deflection portion toward an inner surface of the wall of the first protrusion and prevent the electrons from reaching the electron outflow portion;
a source electrode at the particle inflow portion of the electron propagation channel; and
a drain electrode at the electron outflow portion of the electron propagation channel, wherein the source electrode and the drain electrode are configured to cause a current path of the electrons through the device.

17. The device of claim 16, wherein the first gate electrode is configured to selectively cause the particles to be collected at the first protrusion instead of reaching the electron outflow portion.

18. The device of claim 16, comprising:
a second protrusion in the electron propagation channel at an opposite side of the electron flow deflection portion as the first protrusion,
a second gate electrode at the second protrusion, wherein:
the first gate electrode is at the first protrusion,
each of said gate electrodes is selectively activatable into a first state and a second state,
the first gate electrode, when in said first state, causes the electrons to be collected at the first protrusion instead of reaching the electron outflow portion,
the second gate electrode, when in said first state, causes the electrons to be collected at the second protrusion instead of reaching the electron outflow portion, and
when both of the first and second gate electrodes are in said second state, the electrons flow through the electron propagation channel and reach the electron outflow portion.

19. The device of claim 16, wherein the electron propagation channel has a curved trajectory at the electron flow deflection portion, wherein the first gate electrode is selectively activatable into a first state, in which the first gate electrode prevents the electrons from reaching the electron outflow portion and a second state, in which the first gate electrode deflects the electrons towards said electron outflow portion.

20. The device of claim 16, wherein the electron propagation channel has a width that is comparable with a mean free path of electrons flowing in the electron propagation channel when the device is activated.

* * * * *